(12) United States Patent
Yoshida

(10) Patent No.: US 6,281,099 B1
(45) Date of Patent: Aug. 28, 2001

(54) METHOD FOR SYNTHESIZING SINGLE CRYSTAL AlN THIN FILMS OF LOW RESISTIVITY N-TYPE AND LOW RESISTIVITY P-TYPE

(75) Inventor: Hiroshi Yoshida, Kawanishi (JP)

(73) Assignee: Japan Science and Technology Corporation, Kawaguchi (JP)

( * ) Notice: Subject to any disclaimer, the term of this patent is extended or adjusted under 35 U.S.C. 154(b) by 0 days.

(21) Appl. No.: 09/486,946
(22) PCT Filed: Jun. 24, 1999
(86) PCT No.: PCT/JP99/03384
    § 371 Date: Mar. 6, 2000
    § 102(e) Date: Mar. 6, 2000
(87) PCT Pub. No.: WO00/02240
    PCT Pub. Date: Jan. 13, 2000

(30) Foreign Application Priority Data

Jul. 7, 1998 (JP) ................................... 10-208612

(51) Int. Cl.$^7$ ..................................... H01L 21/20
(52) U.S. Cl. ............................................. 438/507
(58) Field of Search ................... 438/45, 46, 47, 438/478, 507, 509, 535, 796, 918; 117/952, 3, 92, 93, 103, 108

(56) References Cited

FOREIGN PATENT DOCUMENTS

| 2-105408 | 4/1990 | (JP) . |
| 4-346218 | 12/1992 | (JP) . |
| 8-2999 | 1/1996 | (JP) . |
| 9-309795 | 12/1997 | (JP) . |

OTHER PUBLICATIONS

Sinharoy, S. et al., "Molecular beam epitaxy growth and characterization of GAN and AlGaN on 6–H SiC", J. Vac. Sci. Tech. A 14 (3, Pt. 1), pp. 896–899 (no month given), 1996.*

Tang, X. et al. "Near band–edge transition in aluminum nitide thin films grown by metal organic chemical vapor deposition", Appl. Phys. Lett. 72, No. 12, pp. 1501–1503, Mar. 1998.*

Niebuhr, R. et al., "Electrical and optical properties of oxygen doped GaN grown by MOCVD using N2O", J. Elect. Matls. 26, No. 10, pp. 1127–1130, Oct. 1997.*

Tucceri, R.C. et al., "SIMSand CL Characterization of manganese–doped aluminum nitride films", Wide Bandgap Semiconductors for High–Power, High–Frequency, and High Temperature Applications, Materials Researc Society, pp. 413–418 (no month given), 1999.*

Hommerich, U. et al., "Optical characterization of erbium doped III–nitrides prepared by metalorganic molecular beam epitaxy", Materials Reseach Society Sym Proc. p. 537 (no month given), 1999.*

\* cited by examiner

Primary Examiner—Keith Christianson
(74) Attorney, Agent, or Firm—Armstrong, Westerman, Hattori, McLeland & Naughton, LLP

(57) ABSTRACT

In growing single AlN thin films on a semiconductor substrate by rapidly cooling a beam of atomic Al and atomic or molecular N obtained by exciting or decomposing $N_2$ with an electromagnetic wave on the semiconductor substrate, an n-type dopant and a p-type dopant in the form of atomic beams are simultaneously doped in a crystal, so that pairs of an n-type dopant and a p-type dopant are formed in the crystal to synthesize single crystal AlN thin films of low resistivity n-type and low resistivity p-type.

6 Claims, 3 Drawing Sheets

(1) AIN OF LOW RESISTIVITY n-TYPE (2) AIN OF LOW RESISTIVITY p-TYPE

METHOD FOR SYNTHESIZING SINGLE CRYSTAL AlN THIN FILMS OF LOW RESISTIVITY N-TYPE AND LOW RESISTIVITY P-TYPE

FIELD OF THE INVENTION

This invention relates to a method for manufacturing single crystal AlN (aluminum nitride) thin films of low resistivity n-type and low resistivity p-type, which are expected to be used as next generation semiconductors.

TECHNICAL BACKGROUND

A method for forming single crystal AlN thin films by a molecular beam epitaxy method, or the like, is known (for example, Japanese Patent Unexamined Publication Nos. H8(1996)-2999 and H9(1997)-309795).

However, since an AlN has a large band gap energy such as 6.5 eV, and an acceptor or a donor itself has a low impurity level of 500 meV (4000K), carriers cannot be activated at room temperature. As a result, only AlN thin films of high resistivity can be obtained.

OBJECTS TO BE SOLVED BY THE INVENTION

If single crystal thin AlN films of low resistivity p-type and low-resistivity n-type can be synthesized, it is possible to manufacture a high power and high speed semiconductor device operable at high temperature and an ultraviolet semiconductor laser diode essential for a high density recording and a vast information transmittance by the AlN thin films. It is also possible to manufacture a transparent single crystal protective film excellent in electric conductivity and thermal conductivity by an AlN thin film of low resistant n-type, which utilizes high hardness characteristics of the AlN having high hardness next to a diamond. Furthermore, by utilizing the negative electron affinity energy of the AlN, it is possible to manufacture a display having a large surface area (such as a wall-hanging Television Screen) made by highly efficient electron materials of single crystal AlN thin films of low resistant n-type.

MEANS FOR SOLVING THE PROBLEMS

The inventors have found the facts that, in order to solve the aforementioned problems, in forming single crystal AlN thin films on a semiconductor substrate by rapidly cooling a beam of atomic Al and atomic or molecular N obtained by exciting or decomposing $N_2$ with an electromagnetic wave, single crystal AlN thin films of low resistivity n-type and low resistivity p-type can be synthesized by simultaneously doping a n-type dopant and a p-type dopant in the form of atomic beam in a crystal to form pairs of a n-type dopant and a p-type dopant in the crystal.

As shown in FIG. 1, by forming a compound such as an O—C—O or a C—O—C by a simultaneous doping of a C acceptor and an O donor, a lower donor level or a lower acceptor level are formed, resulting in a greatly increased carrier density in an AlN crystal. As a result, AlN thin films of lower resistivity n-type and lower resistivity p-type can be formed.

In the AlN crystal, C as an acceptor and 0 as a donor take a structural position (an impurity compound) of (1) low resistivity n-type AlN or (2) low resistivity p-type AlN which forms the crystal model shown in FIG. 2. The co-existing acceptor atom and donor atom stabilize the crystallography structural position. Accordingly, donors and acceptors can be doped in higher density.

In the method according to the present invention, an atomic O as an n-type dopant and an atomic C as a p-type dopant electrically excited by a radio wave, a laser, an x-ray, an electron beam, or the like, are simultaneously doped.

By controlling Al vapor partial pressure, N vapor partial pressure, n-type dopant vapor partial pressure and p-type dopant vapor partial pressure, the ratio (X/Y) of the n-type dopant atomic density (X) to the p-type dopant atomic density (Y) is controlled to thereby form single crystal thin films of low resistivity n-type at X/Y>1 and single crystal thin films of low resistivity p-type at X/Y<1.

Furthermore, the present invention provides a method for restoring a passivation by a hydrogen. The method includes the steps of cooling AlN thin films of low resistivity n-type and low resistivity p-type crystalized on a semiconductor substrate under low temperature and low pressure, and annealing them at high temperature for a short time in an electric field, so that the donor made of hydrogen is removed from the crystal.

Furthermore, the present invention provides a method for forming a high efficiency spin-polarized electron-beam. The method includes the steps of irradiating a circular polarized laser on a synthesized AlN thin films of low resistivity n-type and low resistivity p-type.

Furthermore, the present invention provides a method for synthesizing single crystal AlN thin films of low resistivity n-type and low resistivity p-type. In the method, in forming single crystal AlN thin films in accordance with a MOCVD method, an acceptor and a donor are simultaneously doped by introducing O(oxygen) as a n-type dopant from $SiO_2$ or sapphire of the substrate and C (carbon) as a p-type dopant from an organic metal compound. (Function)

According to the present invention, the impurity level of an acceptor or a donor can be lowered and the number of carriers can be greatly increased to thereby form single crystal AlN thin films of low resistivity and high quality on a semiconductor substrate. By simultaneously doping a n-type dopant and a p-type dopant, electrostatic energy or lattice energy therebetween is decreased, which enables a stable doping of a n-type dopant and a p-type dopant in high density, resulting in low resistivity. By forming pairs of an n-type dopant and a p-type dopant (impurity compound) in an AlN crystal, electron scattering of n-type and p-type carriers due to dopants can be decreased to thereby increase the carrier movement, resulting in low resistivity. In other words, according to the present invention, single crystal AlN films having a film thickness of about 0.05 to about 1.0 $\mu$m and a film resistivity of 1.0 $\Omega$cm or less can be obtained.

THE BEST MODE FOR CARRYING OUT THE INVENTION

In the present invention, the method for forming a single AlN thin film on a semiconductor substrate by rapidly cooling a beam of atomic Al and atomic or molecular N obtained by exciting or decomposing $N_2$ with an electromagnetic wave on the semiconductor substrate, may be, for example, an organometallic method utilizing compound gas MOCVD method) or a molecular beam epitaxy method utilizing atomic beam MBE method), or other various methods applicable for synthesizing single crystal AlN thin films.

By simultaneously doping a n-type dopant and a p-type dopant during the growth of AlN crystal, the dopants are stabilized in high density, and compounds of the n-type dopant and p-type dopant are formed in the AlN crystal, which decreases the acceptor level or the donor level. By changing the electron scattering mechanism of the carrier into a short-distance force by simultaneously doping the n-type carrier and the p-type carrier, it became possible to greatly increase the movement of the carrier, resulting in low resistivity.

By simultaneously doping an atomic n-type dopant (o) and an atomic p-type dopant in a crystal, a donor-acceptor compound is formed in the crystal to decrease the electrostatic energy or lattice energy therebetween, resulting in a stable doping of the n-type and p-type dopant in high density. Furthermore, since the compound of donor-acceptor compound is formed, the donor level and the acceptor level decrease, resulting in an increased carrier density. Thus, AlN thin films of low resistivity type and low resistivity p-type can be formed.

According to the method of the present invention, materials for an ultraviolet laser semiconductor device or high efficiency electron emitting materials for a large area display utilizing negative electron affinity energy of an n-type AlN crystal, can be formed.

Figure 1:
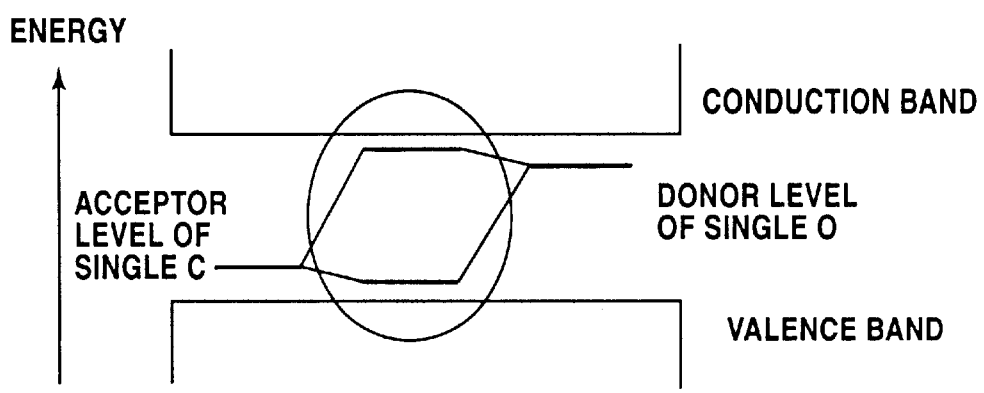
FIG. 1 is an explanatory view showing a principle that a donor level becomes lower by simultaneously doping a donor and an acceptor.
Figure 2:
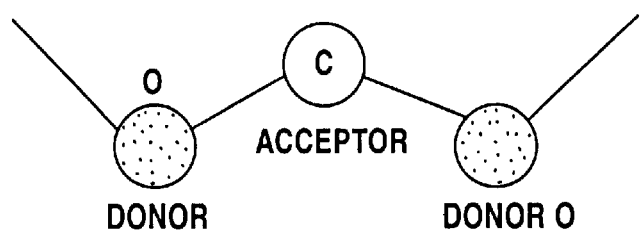
FIG. 2 is an explanatory view showing a donor-acceptor compound formed by simultaneously doping a donor and an acceptor.
Figure 2:
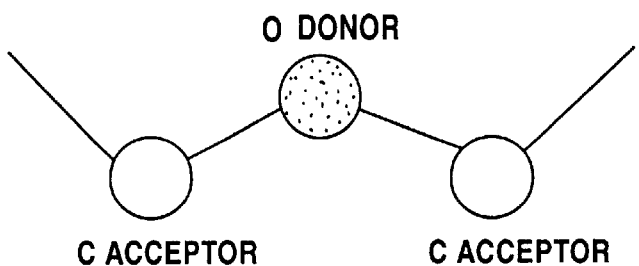
Figure 3:
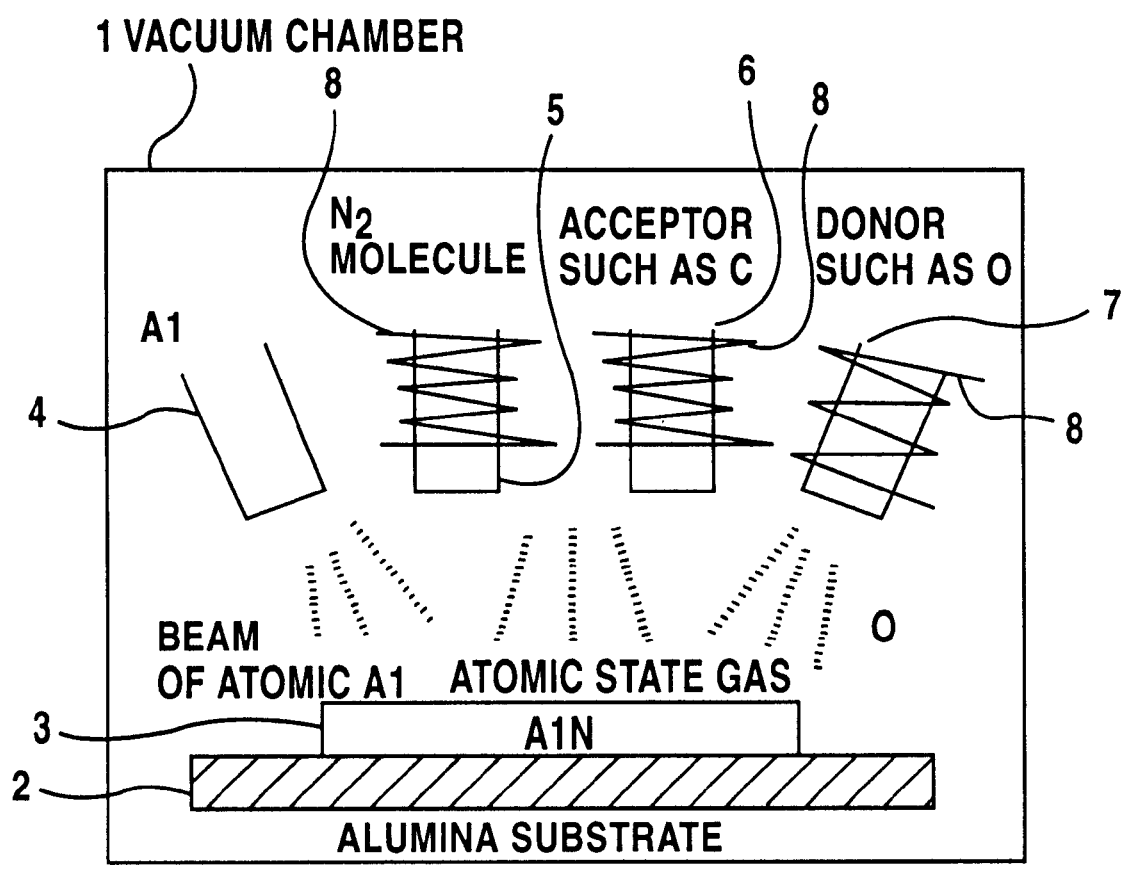
FIG. 3 is a side view showing a concept of a device for executing a simultaneous doping method for forming AlN thin films in accordance with an MBE method.

FIG. 3 shows an example of a schematic side view of a device for executing an MBE method as one of the methods according to the present invention.

An alumina substrate 2 is fixed to a holder (not shown). The substrate 2 is heated to 500° C. to 1150° C. by an electric heater (not shown) in a state that the vacuum chamber 1 is maintained in a vacuumed state by a vacuum evacuating device (not shown). A beam of an atomic Al is emitted toward the substrate 2, and a $N_2$ molecule is emitted toward the substrate 2 from introducing pipe 5. Each material is heated by the RF coil 8 to be decomposed. An acceptor such as C and a donor such as O are emitted toward the substrate 2 from the introducing pipe 6 and the introducing pipe 7, respectively, to simultaneously dope, so that an AlN this films 3 are crystalized on the substrate.

The O as a n-type donor and the C as a p-type acceptor may be an atom of molecular gas ($O_2$, CO, $CO_2$, or the like) formed by irradiating an electromagnetic wave in a micro wave region thereto or an atomic simplicial cell formed by heating at high temperature.

In the method according to the present invention, an atomic O as a n-type dopant and an atomic C as a p-type dopant electrically excited by a radio wave, a laser, an x-ray, an electron beam, or the like, are simultaneously doped. However, these electrical exciting methods may be known methods.

By controlling Al vapor partial pressure, N vapor partial pressure, n-type dopant vapor partial pressure and p-type dopant vapor partial pressure, the ratio (X/Y) of the n-type dopant atomic density (X) to the p-type dopant atomic density (Y) is controlled to thereby form single crystal thin films of low resistivity n-type at X/Y>1 and single crystal thin films of low resistivity p-type at X/Y<1. In detail, according to the MBE method, the values of X and Y are controlled. In n-type, the partial pressure of dopant is adjusted to X:Y=2:1 or 3:1. In p-type, the partial pressure of dopant is adjusted to X:Y=1:2 or 1:3.

EXAMPLES

As shown in FIG. 3, the vacuum chamber 1 was maintained to be vacuum degree of $10^{-10}$ torr, and the alumina substrate 2 was heated by the electrical heater. The Al was heated by an oven heater to irradiate a beam of an atomic Al toward the substrate 2. $N_2$ molecule was excited by the RF coil 8 to supply atomic gas flows of N+ or $N_2$ in an excited state toward the substrate 2 so as to be adhered to the substrate 2. C as an acceptor was emitted toward the substrate 2 from the introducing pipe 6 at the flow rate of $10^{-9}$ torr and O as a donor was emitted toward the substrate 2 from the introducing pipe 7 at the flow rate of $5 \times 10^{-9}$ torr so as to simultaneously dope them to thereby form an AlN crystal at the substrate temperature of 600° C., 650° C., 800° C., 1000°C. and 1100° C. The C as an acceptor and the O as a donor were electrically excited by the RF coil 8 so as to become an atomic gaseous state. After 120 minutes have passed, the crystal growth was interrupted.

The obtained AlN crystal had thickness shown in Table 1 (which also shows the effect that the simultaneous doping of C and O affects the donor density of n-type AlN) and shown in Table 2 (which also shows the effect that the simultaneous doping of C and O affects the acceptor density of p-type AlN). In a case of simultaneous doping of C and O, both the n-type carrier density and the p-type carrier density were higher by a few digits at any crystal growth temperatures, as compared to the case where only the O vapor as a ntype donor was doped without feeding C vapor as p-type dopant. Furthermore, the donor density and the acceptor density were different depending on the crystal growth temperature (the substrate temperature). In addition, the film resistance was 1.0 Ω cm or less, as shown in Tables 1 and 2.

TABLE 1

| Substrate Temperature (° C.) | Film thickness (μm) | Simultaneous doping of C and O | | Single doping of O | |
|---|---|---|---|---|---|
| | | Donor density ($cm^{-3}$) | Film resistivity (Ωcm) | Donor density ($cm^{-3}$) | Film resistivity (Ωcm) |
| 600 | 0.1 | $4 \times 10^{18}$ | 0.95 | $1 \times 10^{14}$ | 3280 |
| 650 | 0.32 | $5 \times 10^{18}$ | 0.80 | $2 \times 10^{14}$ | 2195 |
| 800 | 0.51 | $6 \times 10^{19}$ | 0.75 | $3 \times 10^{14}$ | 1320 |
| 1000 | 0.92 | $8 \times 10^{20}$ | 0.82 | $3 \times 10^{14}$ | 820 |
| 1100 | 1.15 | $8 \times 10^{21}$ | 0.51 | $4 \times 10^{15}$ | 520 |

TABLE 2

| Substrate Temperature (° C.) | Film thickness (μm) | Simultaneous doping of C and O | | Single doping of C | |
|---|---|---|---|---|---|
| | | Acceptor density ($cm^{-3}$) | Film resistivity (Ωcm) | Acceptor density ($cm^{-3}$) | Film resistivity (Ωcm) |
| 600 | 0.12 | $3 \times 10^{18}$ | 1.01 | $1 \times 10^{14}$ | 4110 |
| 650 | 0.35 | $3.5 \times 10^{18}$ | 0.90 | $1.5 \times 10^{14}$ | 3240 |
| 800 | 0.56 | $4 \times 10^{19}$ | 0.89 | $2 \times 10^{14}$ | 2360 |
| 1000 | 0.93 | $5 \times 10^{20}$ | 0.72 | $2.5 \times 10^{14}$ | 1480 |
| 1100 | 1.20 | $6 \times 10^{21}$ | 0.48 | $3 \times 10^{15}$ | 500 |

Figure 4:
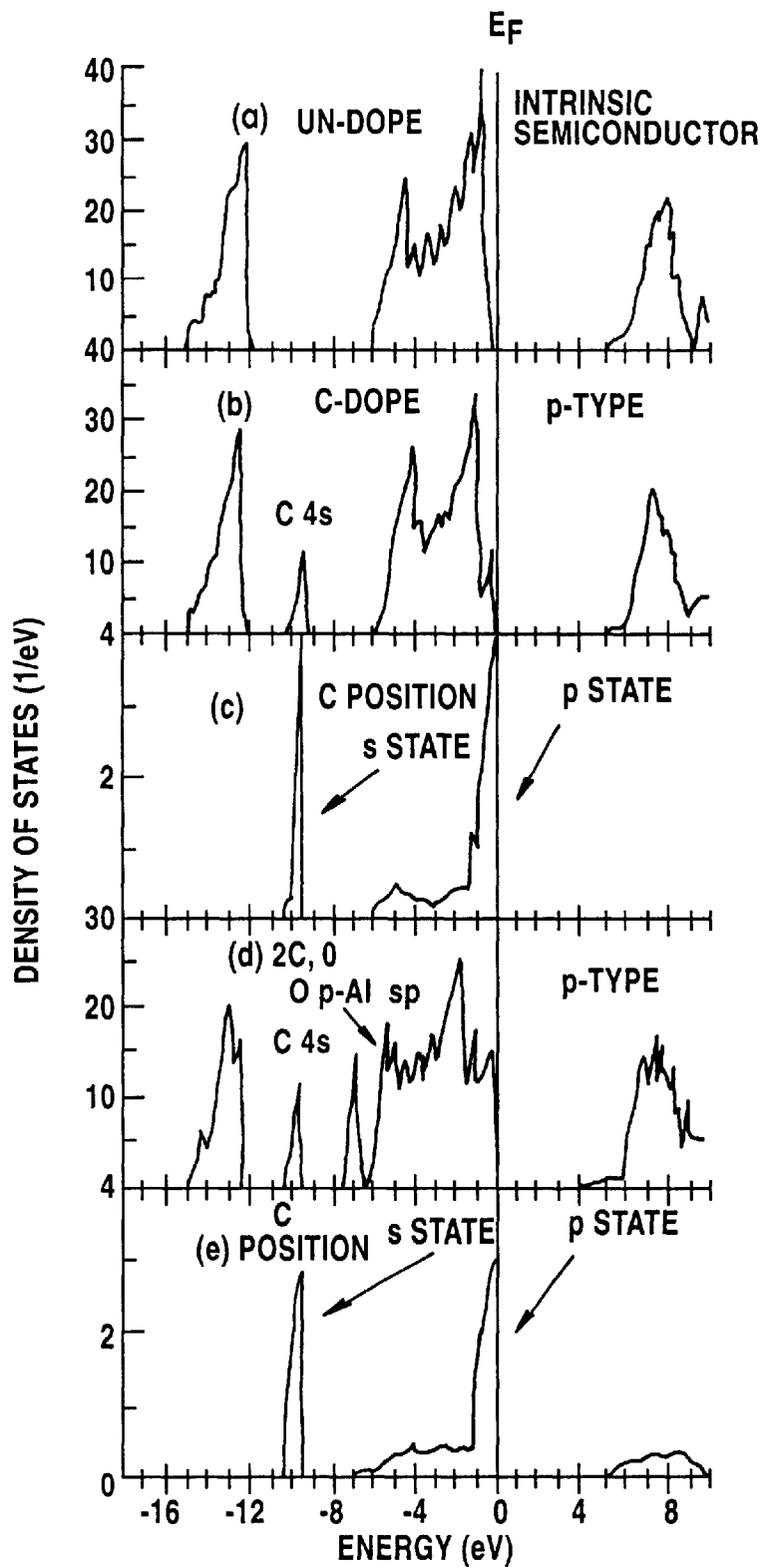
FIG. 4 is a graph showing an electron density of states of a donor acceptor compound (2C+O) formed by simultaneously doping C and O.

FIG. 4 shows electronic density of states of the donor acceptor compound (2C +O) formed by the simultaneous doping of C and O. In FIG. 4, (a) denotes a whole electronic density of states of the AlN (no doping was conducted), (b) denotes a whole electronic density of states of the AlN when C was doped, (c) denotes a partial electronic density of states of the AlN when C was doped, (d) denotes a whole electronic density of states of the AlN when O and C were simultaneously doped, and (e) denotes a partial electron density of the AlN when O and C were simultaneously doped. It is understood that the formation of the compound (2C +O ) causes a decreased acceptor level (see (d)) as compared to the case where only C was doped (see (b)). Thus, the acceptor level becomes 500 meV to several tens of meV, resulting in an increased number of carriers and decreased resistivity.

INDUSTRIAL APPLICABILITY

According to the method of the present invention, since single crystal thin films of low resistivity p-type and low-resistivity n-type can be synthesized, it is possible to manufacture a high power and high speed semiconductor device operable at high temperature and an ultraviolet semiconductor laser diode essential for a high density recording and a vast information transmittance by the AlN thin films.

It is also possible to manufacture transparent single crystal protective films of low resistivity n-type, which utilize high hardness characteristics of the AlN. Furthermore, since single crystal AlN thin films of low resistivity n-type can be manufactured by simultaneously doping a p-type dopant and an n-type dopant, negative electron affinity energy can be obtained. Thus, by irradiating circular polarized laser to the AlN thin film, it is possible to manufacture a high power and high speed display operable at high temperature and having a large surface area (such as a wall-hanging Televison Screen) made by high efficient electron materials.

What is claimed is:

1. A method for synthesizing single crystal AlN thin films of low resistivity n-type and low resistivity p-type, the method including the steps of:

subjecting a beam of atomic Al and atomic or molecular N obtained by exciting or decomposing $N_2$ with an electromagnetic wave to rapid cooling and growing on a semiconductor substrate; and simultaneously doping an n-type dopant and a p-type dopant in the form of atomic beams, so that pairs of an n-type dopant and a p-type dopant are formed in a crystal.

2. The method for synthesizing single crystal AiN thin films of low resistivity n-type and low resistivity p-type as recited in claim 1, wherein an atomic O as an n-type dopant and an atomic C as a p-type dopant electrically excited by a radio wave, a laser, an x-ray, an electron beam, or the like, are simultaneously doped.

3. A method for synthesizing single crystal AlN thin films of low resistivity n-type and low resistivity p-type as recited in claim 1, wherein, Al vapor partial pressure, N vapor partial pressure, n-type dopant vapor partial pressure and ptype dopant vapor partial pressure are controlled so as to control the ratio (X/Y) of the n-type dopant atomic density (X) to the p-type dopant atomic density (Y) to thereby form low resistivity n-type single crystal thin films at X/Y>1 and low resistivity p-type single crystal thin films at X/Y<1.

4. A method for restoring a passivation by a hydrogen, which comprises subjecting AlN thin films of low resistivity n-type and low resistivity p-type as recited in claim 1 to cooling, and then annealing it at high temperature for a short time in an electric field, so that the donor made of hydrogen is removed from the crystal.

5. A method for forming a high efficiency spin-polarized electron-beam, which comprises irradiating a circular polarized laser on the synthesized AlN thin film s of low resistivity n-type and low resistivity p-type synthesized by the method recited in claim 1.

6. A method for synthesizing single crystal AlN thin films of low resistivity n-type and low resistivity p-type synthesized in growing a single crystal AlN thin film by MOCVD method, which comprises simultaneously doping an acceptor and a donor by introducing O(oxygen) as an n-type dopant from $SiO_2$ or sapphire of the substrate and C (carbon) as a p-type dopant from an organic metal compound.

* * * * *